United States Patent [19]

Luteran

[11] 4,162,440
[45] Jul. 24, 1979

[54] LIMIT CONTROLLER

[76] Inventor: Frank K. Luteran, R.D.#1 Box 387, Montdale, Pa. 18447

[21] Appl. No.: 813,943

[22] Filed: Jul. 8, 1977

[51] Int. Cl.² .............................................. G05F 1/44
[52] U.S. Cl. ........................... 323/22 SC; 307/252 W; 323/39; 323/75 E
[58] Field of Search ................ 323/22 SC, 24, 34, 35, 323/36, 37, 39, 75 E; 363/125, 126, 127, 128; 361/198; 307/246, 252 N, 252 P, 252 W

[56] References Cited
U.S. PATENT DOCUMENTS

| 3,334,244 | 8/1967 | Hanchett ........................ 307/252 W |
| 3,356,859 | 12/1967 | Wilson et al. ........................ 363/128 |
| 3,417,297 | 12/1968 | Wallentowitz ........................ 361/198 |
| 3,742,311 | 6/1973 | Gary ................................ 307/252 W |
| 4,031,458 | 6/1977 | Ichikawa ........................ 323/22 SC |
| 4,045,708 | 8/1977 | Neal .................................... 363/126 |

Primary Examiner—Gerald Goldberg

[57] ABSTRACT

A solid state switching controller that switches power to a load when sensor controls indicate that a controlled parameter is outside the high and low limit set by the sensors.

The controller power input is AC while the controller output is selectable as either AC or DC. The controller can be utilized to control high and low impedance loads.

12 Claims, 3 Drawing Figures

LIMIT CONTROLLER

BACKGROUND OF THE INVENTION

This invention relates to a control for switching the current from an AC source to a load when multiple sensors determine that the load should be activated, with the sensors determining the range over which the load is activated.

Various electromechanical means have been utilized to provide control of power to a load during a portion of a sensors operating range. The load being activated when the sensor output is in a specified range. In these electromechanical devices the sensor range has been determined by mechanical means and usually covered a narrow operating range. An example of this type of electromechanical device is a thermostat where a set of contacts is closed when a preset temperature is reached; the contacts controlling power to a load. By mechanical hysteresis means the contacts remain closed until the sensor again passes through the preset temperature to a temperature point different from the preset temperature, at which time the contacts open and power is removed from the load. Controls of this type are necessary to prevent the rapid cycling of motors and other loads when controlled by sensor inputs.

Other types of control devices use electrical hysteresis to control a load over an operating range. These devices rely on the electrical hysteresis of the control to provide the operating range while the sensor provides one of the limit points of the range. The range of operation of this type control is relatively narrow.

With the foregoing in mind, it is a primary objective of the present invention to provide a new and improved limit controller that has a wide preset operating range.

Another object of the present invention is to provide a solid state controller that will energize a load with a DC or AC current over a preset operating range.

A further object of the invention is to provide a controller that has an operating range determined by at least two sensors. Still another object is to provide a controller that will activate a low or high impedance load over a predetermined operating range.

BRIEF DESCRIPTION OF THE INVENTION

The limit controller utilizes an SCR as a switching element in a diode bridge circuit arrangement to control the flow of current from an altenating voltage source through a load. The conductivity of the SCR is controlled by two control inputs, a start-input and a maintain-input. These control inputs may be switches or variable impedance sensors. The start-input has exclusive control of initiating conduction of the SCR. The maintain-input maintains conduction of the SCR once conduction has been established by the start input. Either input can switch the SCR to the non-conducting state provided the other input is not causing the SCR to be conductive.

By selecting appropriate sensors to activate the control inputs, the limit controller will energize a load over a predetermined sensor range. The load may be AC or DC current activated depending on the connection of the load in the circuit.

DETAILED DESCRIPTION OF THE INVENTION

Figure 1:
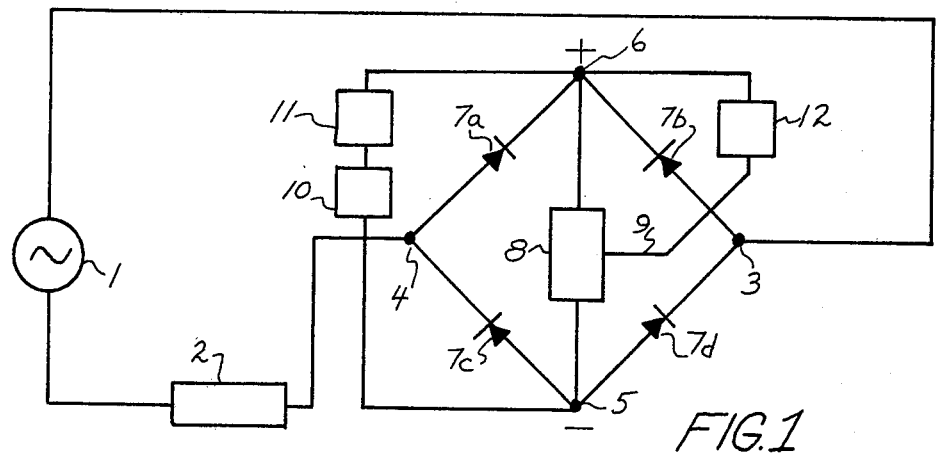
FIG. 1 is a schematic diagram of the invention showing the relationship of the elements.

As shown in FIG. 1, alternating voltage source 1 and load 2 are serially connected to input terminals 3 and 4 of diode bridge 7a, 7b, 7c, 7d. The diode bridge rectifies the alternating voltage and produces positive voltage pulses at +bridge terminal 6 and negative voltage pulses at −bridge terminal 5. Control element 8 is connected between terminals 5 and 6 and causes a unidirectional current to flow from terminal 6 to terminal 5 when control element 8 is made conductive by a signal on control input 9. Start control 12 connected to control input 9 provides a signal to make control element 8 conductive. Removal of the signal from control 12 makes control element 8 non-conductive. When control element 8 is conductive, current flow on positive cycles of voltage source 1, is through diode 7b, control element 8, diode 7c, load 2 and back to source 1. On negative cycles of voltage source 1 current flows from source 1 through load 2, diode 7a, control element 8, diode 7d and back to source 1. The resulting current flow through load 2 is an alternating current present when control element 8 is conductive. When control element 8 is non-conductive, the series paths formed by diodes 7a and 7b and 7c and 7d prevent current flow through the bridge to load 2.

Energy storage element 10 is connected to terminal 5 and maintain control 11. Control 11 provides a path for energy flow into and out of the storage element from terminal 6. When control 11 is actuated, energy is stored in element 10 during the peak values of the positive voltage at terminal 6 and released during the low voltage excursions at terminal 6. The action of maintain control 11 and storage element 10 is to keep the voltage on terminal 6 from falling below a minimum level. Although control element 8 is normally made conductive and non-conductive by a signal on its control input 9, the action of maintain control 11 and energy storage element 10 is to keep element 8 conductive once conduction has been established by start control 12 through control input 9. Devices that can be used as the control element include SCR's and TRIAC's. Removal of the signal from maintain-control 11 or start control 12 will cause control element 8 to become non-conductive provided the other control is not attempting to make control element 8 conductive. By actuating maintain-control 11 and start-control 12 from appropriate sensors a controller can be operated over a range defined by the sensors.

Figure 2:
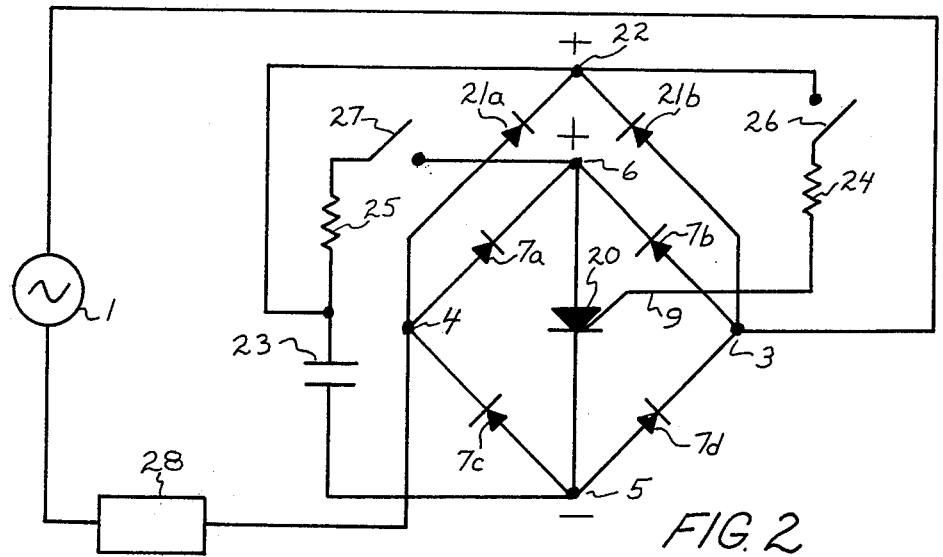
FIG. 2 is a schematic diagram of the invention showing the embodiment for energizing a high impedance load.

In FIG. 2, alternating voltage source 1 and high impedance load 28 are serially connected to input terminals 3 and 4 of diode bridge 7a, 7b, 7c, 7d. The diode bridge rectifies the alternating voltage and produces positive voltage pulses at bridge terminal 6 and negative voltage pulses at bridge terminal 5. SCR 20 is connected across bridge terminals 5 and 6 and functions to make the bridge conductive or non-conductive and thereby controls the AC current through load 28. Auxiliary diode 21a is anode connected to input terminal 4 and cathode connected to + terminal 22 and energy storage capacitor 23. Auxiliary diode 21b is anode connected to input terminal 3 and cathode connected to + terminal 22 and capacitor 23. The auxiliary diodes and storage capacitor produce a steady positive voltage at + terminal 22 through rectification and filtering of the alternating voltage from voltage source 1. The positive voltage at 22 is applied to control input 9 through start switch 26 and current limiting resistor 24, and bridge terminal 6 through maintain switch 27 and energy limiting resistor 25. In operation, the closing of start switch 26 causes SCR 20 to become conductive resulting in AC current flow through high impedance load 28. The closing of maintain switch 27 causes SCR 20 to remain conductive after start switch 26 opens. SCR 20 then remains conductive until maintain switch 27 opens. When SCR 20 is non-conductive, closing of maintain switch 27 does not cause conduction. Only the closing of start switch 26 causes SCR 20 to become conductive. The high impedance load 28 being controlled may be a relay, motor, heater, or incandescent lamp.

Figure 3:
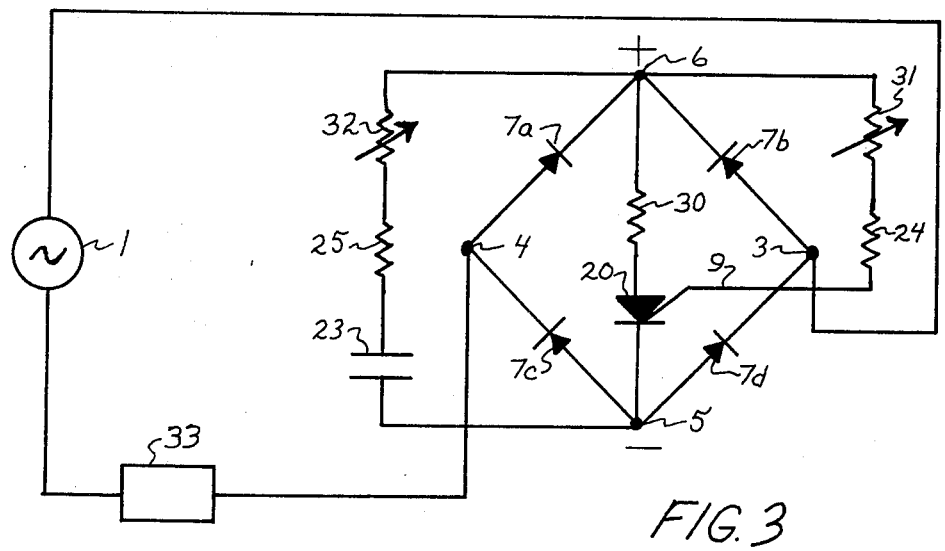
FIG. 3 is a schematic of the invention showing the circuit for energizing a low impedance load.

In the circuit of FIG. 3 alternating voltage source 1 is connected through diode bridge 7a, 7b, 7c, 7d to low impedance load 33. SCR 20 in series connection with load limit resistor 30 is connected across bridge terminals 5 and 6. Conduction of the diode bridge is determined by the conductive state of SCR 20 with the current to low impedance load 33 determined by the value of load limit resistor 30. SCR 20 is made conductive by current flow into control input 9 from bridge terminal 6 through current limiting resistor 24 and start impedance 31. When start impedance 31 is decreased to a low value, sufficient current flows into control input 9 to cause SCR 20 to become conductive. Maintain impedance 32 in series with energy limiting resistor 25 and energy storage capacitor 23 applies a voltage to bridge terminal 6. When maintain impedance 32 is decreased to a low value sufficient current flows into bridge terminal 6 to keep SCR 20 in a conductive state after initial conduction has been established by the action of start impedance 31. Start impedance 31 increasing to a higher value will not now cause SCR 20 to become non-conductive due to the action of maintain impedance 32 and energy storage capacitor 23. SCR 20 will remain conductive until maintain impedance 32 is increased to reduce the voltage applied to bridge terminal 6 below a predetermined minimum. SCR 20 will remain non-conductive until start impedance 31 is decreased to a value that will enable the control input to provide sufficient current to make the SCR conductive. The low impedance load 33 being controlled may be a light emitting diode (LED), the gate of a semiconductor or other low impedance semiconductor device.

Although the figures have shown loads connected for energization by an AC current, the loads may be connected in series with the control element and the positive terminal of the diode bridge for energization by a DC current. Operation of the start and maintain functions remain the same for the D.C. load connection.

A useful application of the invention could be the operation of an air compressor where it is desired that the compressor maintain an air pressure between a low and high limit. The pressure sensor switches are selected to be closed when the measured pressure is below the pressure sensor set point. The high pressure sensor is connected as the maintain control and the low pressure sensor is connected as the start control. The compressor motor relay coil is connected as an AC high impedance load. When the pressure is within the high and low values, the high pressure sensor is closed and the maintain control is activated. Since the maintain control cannot start conduction of the control element, the load is not energized. As pressure drops below the low limit, the low pressure sensor is closed and the start control is activated. The control element is made conductive and the load is energized. The compressor starts to increase the air pressure to the low limit, the low pressure sensor opens and the start control is deactivated, the control element remains conductive since the maintain control is still activated. As pressure increases to the high limit, the high pressure sensor opens and the maintain control is deactivated. The control element switches to the non-conductive state, the load is deactivated, and the compressor is turned off. The compressor does turn on until once again pressure falls below the low limit value.

I claim:
1. A circuit for regulating current flow from an alternating voltage, through a load, which comprises;
   a. a diode bridge having first and second input terminals and first and second bridge terminals, the alternating voltage connected to the input terminals and producing positive voltage pulses at the first bridge terminal and negative voltage pulses at the second bridge terminal;
   b. a control element connected in series with the bridge terminals, the control element having a control input;
   c. a first control connected to the control input and the first bridge terminal capable of conducting a signal into the control input thereby making the control element conductive;
   d. energy storage means storing DC energy for conduction through the control element, a first side of the storage means connected to the second bridge terminal;
   e. a second control serially connected to a second side of the energy storage means and the first bridge terminal and capable of conducting DC energy from the storage means to the bridge and maintaining conduction of the control element, the energy storage means and the second control connected in parallel relationship with the first and second bridge terminals.

2. The circuit of claim 1 wherein the first control includes a switching element and the second control includes a switching element.

3. The circuit of claim 1 wherein the first control includes a variable impedance element and the second control includes a variable impedance element.

4. The circuit of claim 1 wherein the load is connected in series with the alternating voltage and an alternating current flows through the load.

5. The circuit of claim 4 wherein the energy storage means is charged through a pair of auxiliary diodes connected to the first and second input terminals and the second side of the storage means.

6. The circuit of claim 5 wherein the control element includes an SCR.

7. The circuit of claim 1 wherein a load limiting resistor is connected in series with the control element thereby limiting current flow in the load.

8. The circuit of claim 1 wherein a first limiting resistor is serially connected to the storage means thereby regulating the flow of energy.

9. A circuit for controlling current flow from an alternating voltage source through a load in response to first and second switch inputs, which comprises;
   a. a diode bridge connected to the load and the voltage source;

b. a control element connected to the bridge and making the bridge conductive upon actuation of the first switch;

c. energy storage means in parallel connection with the bridge and maintaining the bridge conductive upon actuation of the second switch.

10. The circuit of claim 9 wherein the energy storage means includes a capacitor.

11. The circuit of claim 9 wherein the control element contains a semiconductor device.

12. The circuit of claim 9 wherein the load is serially connected with the bridge and the voltage source and current flow through the load is alternating current.

* * * * *